(12) United States Patent
Matsugi

(10) Patent No.: US 7,876,029 B2
(45) Date of Patent: Jan. 25, 2011

(54) PIEZOELECTRIC DEVICE WITH IRRADIATION DAMAGE PREVENTING SEAL

(75) Inventor: Kiyotaka Matsugi, Hiratsuka (JP)

(73) Assignee: Epson Toyocom Corporation, Tokyo (JP)

( * ) Notice: Subject to any disclaimer, the term of this patent is extended or adjusted under 35 U.S.C. 154(b) by 81 days.

(21) Appl. No.: 12/361,031

(22) Filed: Jan. 28, 2009

(65) Prior Publication Data

US 2009/0195125 A1 Aug. 6, 2009

(30) Foreign Application Priority Data

Feb. 1, 2008 (JP) .............. 2008-022430

(51) Int. Cl.
*H01L 41/053* (2006.01)
*H01L 41/08* (2006.01)

(52) U.S. Cl. ...................... 310/348; 310/344

(58) Field of Classification Search .......... 310/344, 310/348, 370
See application file for complete search history.

(56) References Cited

U.S. PATENT DOCUMENTS

| 7,060,520 B2* | 6/2006 | Kawauchi et al. ........... 438/51 |
| 7,279,824 B2* | 10/2007 | Tanaya et al. ............... 310/344 |
| 2008/0211350 A1* | 9/2008 | Tanaya et al. ............... 310/328 |
| 2009/0267165 A1* | 10/2009 | Okudo et al. ............... 257/415 |
| 2010/0102678 A1* | 4/2010 | Saita ....................... 310/344 |

FOREIGN PATENT DOCUMENTS

| JP | A-61-100998 | 5/1986 |
| JP | A-2002-009577 | 1/2002 |
| JP | A-2005-223612 | 8/2005 |
| JP | A-2005-244500 | 9/2005 |

\* cited by examiner

*Primary Examiner*—J. SanMartin
(74) *Attorney, Agent, or Firm*—Oliff & Berridge, PLC

(57) ABSTRACT

A piezoelectric device includes: a piezoelectric resonator element; a package storing the piezoelectric resonator element therein in a manner to mount the piezoelectric resonator element on a base portion thereof composed of at least three layers that are layered; and a through hole penetrating through the base portion. In the device, the through hole includes a first hole formed on a first layer which is positioned to face the piezoelectric resonator element among the three layers; a second hole formed on a second layer contacting with the first layer; a third hole formed larger than the second hole on a third layer contacting with the second layer; and a metal coat formed on an inner wall surface of the second hole, and a sealing part for sealing the package is formed with a sealant in at least the second hole.

4 Claims, 4 Drawing Sheets

PIEZOELECTRIC DEVICE WITH IRRADIATION DAMAGE PREVENTING SEAL

BACKGROUND

1. Technical Field

The present invention relates to a piezoelectric device and a method for manufacturing a piezoelectric device.

2. Related Art

In piezoelectric devices as typified by a piezoelectric resonator and a piezoelectric oscillator, for example, that are used in various electronic devices such as information equipment and mobile communication equipment, the following structure is known as a sealing structure of a package.

JP-A-2002-9577, for example, discloses the structure. In the structure, a portion (a base portion) of a package has a stepped opening composed of a first hole and a second hole. The first hole has a predetermined diameter and is opened inward the package, while the second hole has a larger diameter than the first hole and is opened outward. A metal coat is provided to a stepped part that is a bottom part of the second hole and to an inner periphery surface of the second hole. Further, a sealant is put in the opening and melted so as to seal the opening.

In the piezoelectric device of the above example, the base portion is composed of two ceramic substrates. The first hole and the second hole are respectively formed on these ceramic substrates, and the ceramic substrates are layered so as to form the stepped opening (hereinafter, referred to as a through hole). Therefore, the ceramic substrates may be layered in a manner to position the first hole and the second hole eccentric to each other. As a result, in the piezoelectric device, a distance from the inner periphery surface of the first hole to the inner wall surface of the second hole in the through hole is not even throughout the whole circumference. Therefore, the sealant that is melted does not evenly spread, forming a void (a bubble) disadvantageously.

Further, in the piezoelectric device described above, the sealant having a spherical shape is melted by being irradiated with a laser beam or the like so as to seal the through hole. At this time, the sealant does not spread inside the first holes but spreads to cover the first hole. The thickness of the sealant after the sealing is small at the center part of the second hole and large at the inner wall surface part due to wettability. An amount of the sealant is set depending on a volume of the through hole. If the amount is too large, the sealant flows out of the through hole to the external side of the package in the sealing. A through hole is commonly formed at a mounting side on external equipment, so that the overflow of the sealant may adversely affect the mounting of the device on the external equipment.

Therefore, in the piezoelectric device, more amount of sealant can not be put in the through hole, so that the smaller amount of the sealant caused by variation may produce an opening in a part having smaller thickness in the melting of the sealant.

Thus, the piezoelectric device has a problem of a sealing defect of the package and a problem that a piezoelectric resonator element stored in the package is irradiated with a laser beam or the like that passes through the opening and is damaged.

In order to prevent the damage of the piezoelectric resonator element caused by the opening in the sealant, the metal coat is provided to the inner wall surface of the first hole so as to allow the sealant to spread in the inner wall surface of the first hole as well and thus fill the first hole with the sealant (refer to FIG. 9 of JP-A-2002-9577, for example). However, in this case, the sealant that fills the first hole may overflow from the first hole to the inside of the package and contact with the piezoelectric resonator element, reducing the vibrating performance of the piezoelectric resonator element.

In order to prevent the overflow of the sealant to the inside of the package, a forming range of the metal coat is set to be up to the halfway position of the inner wall surface of the first hole.

However, in this case, a technique to form the metal coat up to the halfway position is not established, so that it is hard to manufacture components at a mass-production level.

SUMMARY

The invention is proposed in order to solve the above-mentioned problems and can be achieved according to the following aspects.

A piezoelectric device according to a first aspect of the invention includes: a piezoelectric resonator element; a package storing the piezoelectric resonator element therein in a manner to mount the piezoelectric resonator element on a base portion thereof composed of at least three layers that are layered; and a through hole penetrating through the base portion. In the device, the through hole includes a first hole formed on a first layer which is positioned to face the piezoelectric resonator element among the three layers; a second hole formed on a second layer contacting with the first layer; a third hole formed larger than the second hole, on a third layer contacting with the second layer; and a metal coat formed on an inner wall surface of the second hole, and a sealing part for sealing the package is formed with a sealant in at least the second hole.

In the piezoelectric device of the first aspect, the through hole includes the first hole formed on the first layer which is positioned to face the piezoelectric resonator element; the second hole formed on the second layer; the third hole formed larger than the second hole on the third layer; and the metal coat formed on the inner wall surface of the second hole. Further, the sealing part for sealing the package is formed with the sealant in the second hole of the through hole.

Thus, in the piezoelectric device, the sealing part is formed at least in the second hole with the sealant. Accordingly, in the piezoelectric device of the aspect, when a sealing operation is performed by irradiating the sealant with a laser beam or the like, the sealant does not thinly spread and cover the second hole in the sealing operation so as not to generate an opening unlike the related art.

Accordingly, the piezoelectric device can reduce the sealing defect of the package and prevent such problem that the piezoelectric resonator element stored in the package is irradiated with the laser beam or the like that passes through the opening and damaged.

Further, in the piezoelectric device of the aspect, the metal coat is not formed in the first hole, which is positioned to face the piezoelectric resonator element, of the base portion, so that it is hard for the sealant to spread from the second hole to the first hole in the sealing operation described above. Therefore, in the piezoelectric device of the aspect, the sealant does not overflow from the base portion toward the piezoelectric resonator element, so that the following disadvantage can be avoided unlike the related art. In the related art, the sealant that overflows contacts with the piezoelectric resonator element so as to lower the vibrating performance of the piezoelectric resonator element.

In the piezoelectric device, the first hole has the shape same as or smaller than the second hole. Therefore, setting the size of the first hole smaller than the beam diameter of the laser beam or the like, for example, can prevent the laser beam or the like from passing through the first hole.

Accordingly, the piezoelectric device can prevent the piezoelectric resonator element stored in the package from being irradiated with the laser beam or the like that passes through the opening and being damaged.

In the device of the aspect, it is preferable that the second hole have one of a shape same as the first hole and a shape larger than the first hole.

In the device of the aspect, it is preferable that the metal coat be extended to an exposed surface, which is exposed inside the third hole, of the second layer.

In the device of the aspect, it is preferable that the metal coat be formed on an inner wall surface of the third hole of the third layer.

In the piezoelectric device of the aspect, the metal coat is formed on the inner wall surface of the third hole of the third layer. Therefore, when the sealant overflows from the second hole to spread on the exposed surface of the second layer in the sealing, the sealant evenly spreads with greater ease than the above case due to wettability with respect to the metal coat. Accordingly, the piezoelectric device can reduce the generation of a void in the sealing part. In addition, the piezoelectric device can suppress the overflow of the sealant from the third hole of the third layer due to the wettability with respect to the metal coat.

In the device of the aspect, it is preferable that the piezoelectric resonator element be a tuning fork type resonator element, and the first layer have an opening formed on a portion thereof overlapping with an end portion of the tuning fork type resonator element in a planar view.

In the piezoelectric device of the aspect, the piezoelectric resonator element is the tuning fork type resonator element, and the opening is formed on a portion, which overlaps with the end portion of the tuning fork type resonator element, of the first layer. Accordingly, the piezoelectric device can avoid a contact between the end portion of the tuning fork type crystal resonator element and the first layer of the base portion caused by flexure of the tuning fork type crystal resonator element when the device receives a shock from the outside.

A method, according to a second aspect of the invention, for manufacturing a piezoelectric device that has a piezoelectric resonator element, a package storing the piezoelectric resonator element therein in a manner to mount the piezoelectric resonator element on a base portion thereof composed of at least first to third layers that are layered, and a through hole penetrating through the base portion, includes: a) preparing the first layer having a first hole and positioned to face the piezoelectric resonator element; the second layer having a second hole and contacting with the first layer; and the third layer having a third hole, which is formed larger than the second hole, and contacting the second layer, and contacting the second layer; b) forming a metal coat on an inner wall surface of the second hole formed on the second layer; c) forming a base portion in such a way that the first to third layers are layered in a manner to allow the first to third holes to overlap with each other so as to form the through hole, and the first to third layers are fired so as to be bonded to each other; d) mounting the piezoelectric resonator element on the first layer of the base portion; and e) sealing the package by a sealing part formed at least in the second hole in such a way that a sealant is put in the third hole and melted in one of vacuum and inert gas so as to fill at least the second hole.

In the method of the second aspect, the metal coat is formed on the inner wall surface of the second hole of the second layer, the first to third layers are layered in a manner to allow the first to third holes to overlap with each other so as to form the through hole, and then the first to third layers are fired so as to be bonded to each other. Subsequently, the piezoelectric resonator element is mounted on the first layer of the base portion, the sealant is put in the third hole and melted in the vacuum or in the inert gas so as to fill the second hole. Thus, the sealing part is formed and the package is sealed.

Accordingly, the method of the second aspect can provide a piezoelectric device having a similar advantage to that of the first aspect.

In the method of the aspect, it is preferable that the metal coat be formed by printing a metal film and vacuuming the metal film so as to extend the metal coat to an exposed surface, which is exposed inside the third hole, of the second layer.

In the method, the metal coat is formed by printing the metal film and sucking the metal film that is printed. Thus the metal coat can be easily formed by a common technique.

The method of the second aspect further includes forming the metal coat on an inner wall surface of the third hole of the third layer.

In the method, the metal coat is formed on the inner wall surface of the third hole of the third layer, so that the method can provide a piezoelectric device having a similar advantage to that of the above case.

BRIEF DESCRIPTION OF THE DRAWINGS

The invention will be described with reference to the accompanying drawings, wherein like numbers reference like elements.

DESCRIPTION OF EXEMPLARY EMBODIMENT

Hereinafter, a piezoelectric device and a method for manufacturing a piezoelectric device will be described with reference to the accompanying drawings.

Figure 1A:
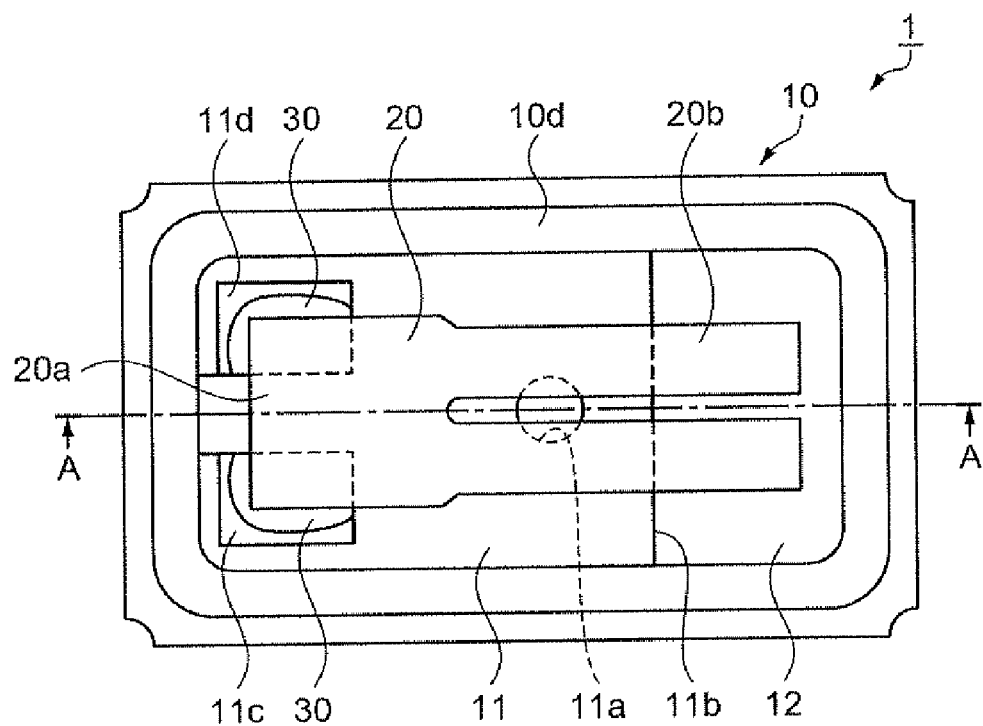
FIGS. 1A and 1B are diagrams schematically showing a structure of a crystal resonator according to an embodiment.
Figure 1B:
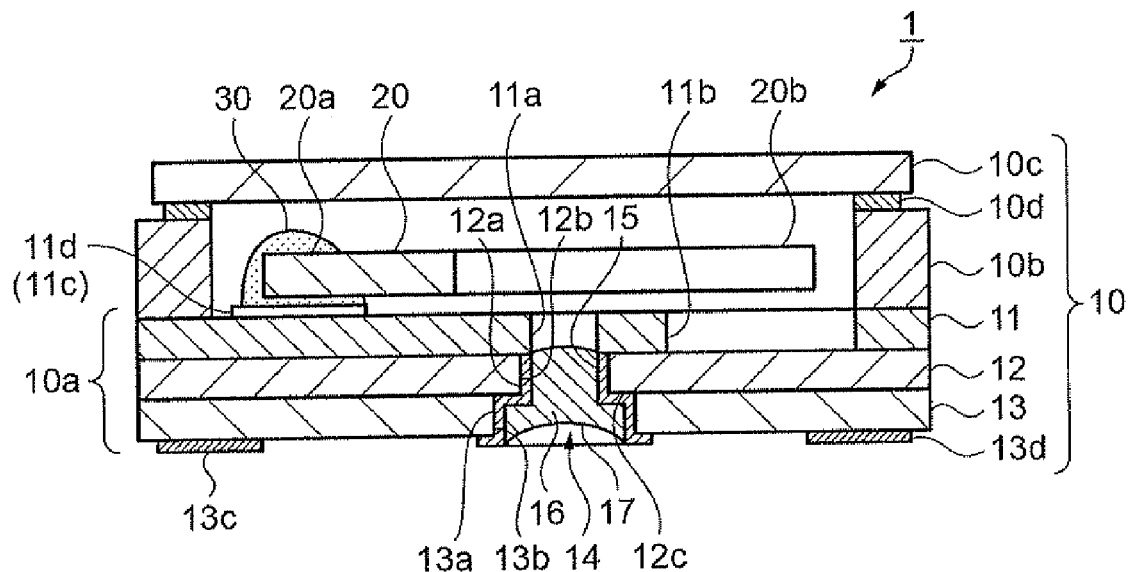

FIGS. 1A and 1B are structural diagrams schematically showing a structure of a crystal resonator as an example of the piezoelectric device. FIG. 1A is a plan view, and FIG. 1B is a sectional view taken along the line A-A of FIG. 1A. Here, the plan view shows no lid portion so as to facilitate understanding.

Referring to FIG. 1A, a crystal resonator 1 according to an embodiment includes a tuning fork type crystal resonator element 20 as a piezoelectric resonator element, a package 10, and the like. The package stores the crystal resonator element 20 therein in a manner to mount the crystal resonator element 20 on a base portion 10a thereof. The base portion 10a is composed of three layers, namely, a first layer 11, a second layer 12, and a third layer 13 that are layered. The crystal resonator 1 is provided with a through hole 14 penetrating through the base portion 10a.

The through hole 14 is composed of a first hole 11a, a second hole 12a, a third hole 13a, and the like. The first hole 11a is formed on the first layer 11, which is positioned to face the tuning fork type crystal resonator 20, among the three layers 11, 12, and 13. The second hole 12a is formed on the second layer 12 contacting with the first layer 11 so as to have a shape same as or larger than the first hole 11a. The third hole 13a is formed on the third layer 13 contacting with the second layer 12 so as to have a larger size than that of the second hole 12a. In the embodiment, the three holes 11a, 12a, and 13a are formed to have a circular shape. The through hole 14 is provided with a metal coat 15 formed on an inner wall surface 12b of the second hole 12a; on an exposed surface 12c, which is exposed inside the third hole 13a, of the second layer 12; and on an inner wall surface 13b of the third hole 13a. The metal coat 15 provided on the through hole 14 is formed by layering coats of nickel and gold on a metallization layer made of tungsten or the like. The metal coat 15 is not formed on the first hole 11a.

The package 10 is composed of the base portion 10a, a frame portion 10b, a lid portion 10c, a bonding portion 10d, and the like.

The three layers 11, 12, and 13 of the base portion 10a are aluminum oxide-based sintered bodies obtained by shaping and firing ceramic green sheets, for example.

On the first layer 11 of the base portion 10a, electrodes 11c and 11d composed of a metal film are formed, and the tuning fork type crystal resonator element 20 is mounted in a manner to position its electrode parts, which are not shown, on the electrodes 11c and 11d. The tuning fork type crystal resonator element 20 is electrically coupled and fixed to the electrodes 11c and 11d at its base portion 20a through the electrode parts with a conductive adhesive 30 or the like.

Further, on the first layer 11, an opening 11b is formed on a part which overlaps with an end portion 20b of the tuning fork type crystal resonator element 20 in a planar view.

On an exterior surface of the third layer 13 of the base portion 10a, mounting terminals 13c and 13d composed of a metal film are formed. The mounting terminals 13c and 13d are respectively coupled to the electrodes 11c and 11d by internal wirings (not shown) of the base portion 10a.

On the base portion 10a, the frame portion 10b is stacked. The frame portion 10b is formed in a manner to surround the tuning fork type crystal resonator element 20. The frame portion 10b is composed of an aluminum oxide-based sintered body obtained by shaping and firing a ceramic green sheet, as is the case with the base portion 10a.

On the frame portion 10b, the lid portion 10c is disposed in a manner to cover the tuning fork type crystal resonator element 20. The lid portion 10c is made of metal such as kovar, and is bonded to the frame portion 10b by seam welding, brazing, or the like with the bonding portion 10d interposed therebetween. The bonding portion 10d is also made of metal such as kovar.

The crystal resonator 1 includes a sealing part 17 that is composed of a sealant 16 made of gold-germanium alloy, for example, at least in the second hole 12a of the through hole 14 so as to seal the package 10. Thus the inside of the package 10 is sealed air-tightly, in the crystal resonator 1. The inside of the package 10 is vacuumed, or filled with inert gas such as nitrogen, helium, and argon.

Here, a process of forming the sealing part 17 is described. The sealant 16 is first shaped in a spherical fashion and is put in the third hole 13a of the third layer 13. A diameter of the sealant 16 having a spherical shape is set to be smaller than that of the third hole 13a and larger than that of the second hole 12a. Accordingly, the sealant 16 is disposed so as to contact with an edge portion of the second hole 12a and cover the second hole 12a.

Then the sealant 16 is melted by being irradiated with a laser beam (not shown) or by heated with a heating device (not shown).

The sealant 16 that is melted first spreads on the inner wall surface 12b of the second hole 12a of the second layer 12, on which the metal coat 15 is formed, due to its wettability with respect to the metal coat 15 so as to fill the second hole 12a.

Then the sealant 16 overflowing from the second hole 12a evenly spreads in a radial fashion from the exposed surface 12c of the second layer 12 to the inner wall surface 13b of the third hole 13a. At this time, the thickness of the sealant 16 from the exposed surface 12c gets thicker from the center of the third hole 13a toward the inner wall surface 13b of the third hole 13b due to the wettability.

Accordingly, the sealant 16 overflowing from the second hole 12a is not hemispherically raised and is not protruded to the outside of the package 10.

On the other hand, the metal coat 15 is not formed in the first hole 11a of the first layer 11, so that it is hard for the sealant 16 filling the second hole 12a to spread in the first hole 11a due to the lack of wettability. In addition, the first hole 11a has the shape same as or smaller than the second hole 12a, so that it is harder for the sealant 16 to spread in the first hole 11a.

Accordingly, the sealant 16 does not flow out of the first hole 11a of the first layer 11 to the inside of the package 10.

As described above, in the crystal resonator 1 of the embodiment, the through hole 14 includes the first hole 11a of the first layer 11, the second hole 12a of the second layer 12, the third hole 13a of the third layer 13, and the metal coat 15 formed on the inner wall surface 12b of the second hole 12a and the exposed surface 12c. In addition, the crystal resonator 1 is provided with the sealing part 17 that is composed of the sealant 16 at least in the second hole 12a so as to seal the package 10.

Accordingly, in the crystal resonator 1, when the sealant 16 for forming the sealing part 17 is irradiated with the laser beam or is heated by the heating device, no opening is produced unlike the related art. In the related art, the sealant 16 which is melted is thinly spreads and covers the second hole 12a so as to produce an opening when the sealant 16 is irradiated or heated.

Thus, the crystal resonator 1 can reduce sealing defect of the package 10 and prevent the tuning fork type crystal resonator element 20 stored in the package 10 from being irradiated with a laser beam that comes through the opening and being damaged.

Further, in the crystal resonator 1, the metal coat 15 is not formed in the first hole 11a, which is positioned to face the tuning fork type crystal resonator element 20, of the base portion 10a, so that it is hard for the sealant 16 to spread from the second hole 12a to the first hole 11a in forming the sealing part 17.

Accordingly, the sealant 16 does not flow out of the base portion 10a toward the tuning fork type crystal resonator element 20, so that the crystal resonator 1 can prevent the vibrating performance of the tuning fork type crystal resonator element 20 from being decreased unlike the related art. In the related art, the sealant 16 contacts with the tuning fork type crystal resonator element 20 and the vibrating performance of the crystal resonator element 20 is decreased.

Further, in the crystal resonator 1, the metal coat 15 is formed on the inner wall surface 13b of the third hole 13a of the third layer 13. Accordingly, in the crystal resonator 1, the sealant 16 flowing out of the second hole 12a in forming the sealing part 17 evenly spreads in a radial fashion from the second hole 12a through the exposed surface 12c of the second layer 12 to the inner wall surface 13b of the third hole 13a.

Therefore, the crystal resonator 1 can reduce the generation of a void in the sealing part 17. The metal coat 15 is formed on the inner wall surface 13b of the third hole 13a, so that the sealant 16 can be prevented from flowing out of the third hole 13a of the third layer 13 due to the wettability with respect to the metal coat 15, in the crystal resonator 1.

Further, in the crystal resonator 1, the opening 11b is formed on a part, which overlaps with the end portion 20b of the tuning fork type crystal resonator element 20 in the planar view, of the first layer 11. By this structure, the crystal resonator 1 can prevent a contact between the end portion 20b of the tuning fork type crystal resonator element 20 and the first layer 11 of the base portion 10a caused by flexure of the tuning fork type crystal resonator element 20 when the crystal resonator 1 receives a shock from the outside.

In the crystal resonator 1, since the sealing part 17 is formed at least in the second hole 12a, the sealant 16 does not necessarily spread in the third hole 13a of the third layer 13. The crystal resonator 1 having such structure can reduce thickness of the third layer 13 more than the related art structure.

Since the sealant 16 does not necessarily spread in the third hole 13a of the third layer 13, adequate setting of the sizes of the second hole 12a and the third hole 13a can reduce the amount of the sealant 16 more than the related art structure.

Figure 2:
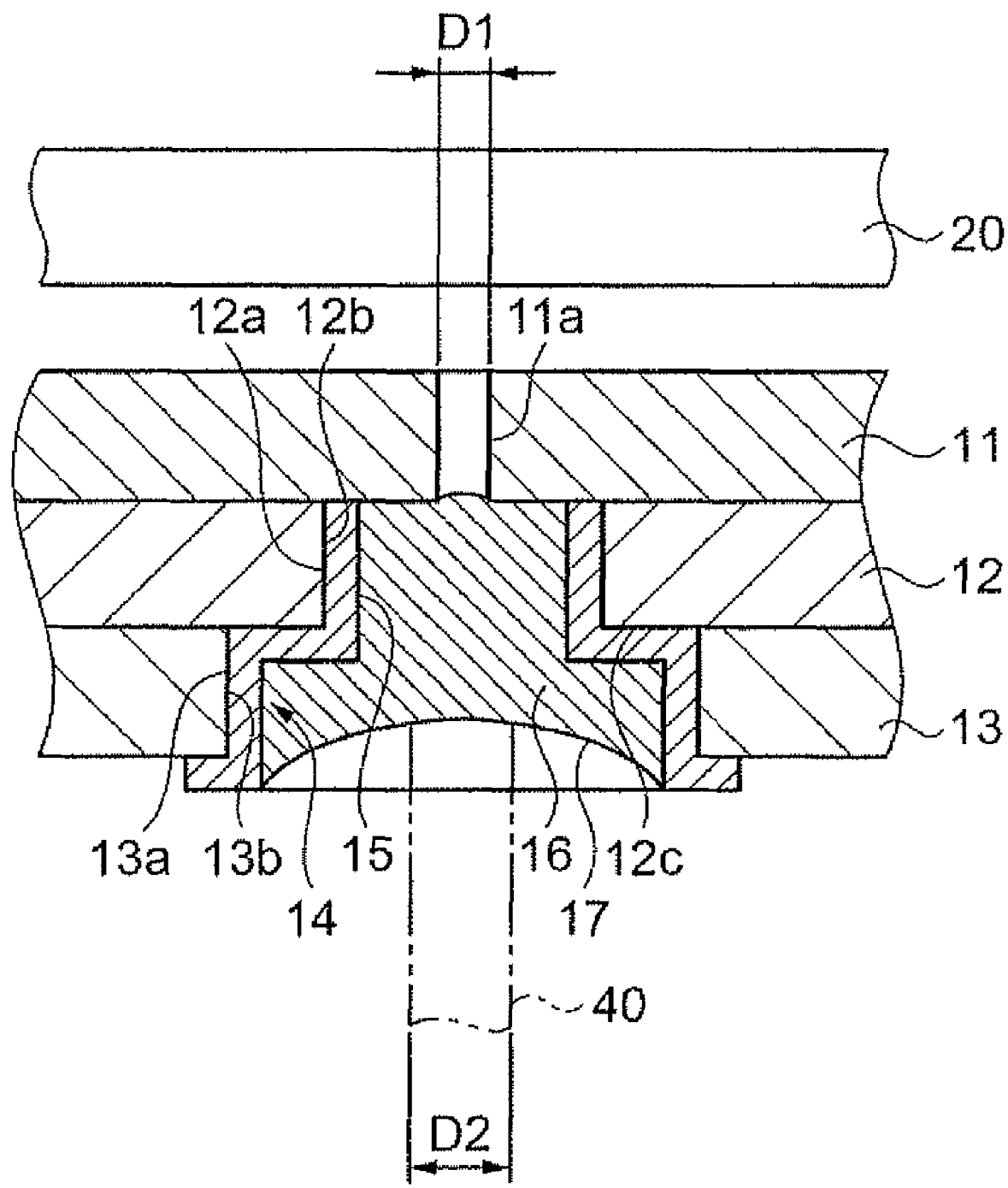
FIG. 2 is a sectional view showing a main part of the crystal resonator of the embodiment.

In the crystal resonator 1, a diameter D1 of the first hole 11a of the first layer 11 may be set to be smaller than a beam diameter D2 of a laser beam 40 and the like, as shown in a sectional view of a main part of a crystal resonator in FIG. 2. With this structure, the laser beam 40 or the like can not pass through the first hole 11a of the first layer 11, so that the tuning fork type crystal resonator element 20 can be prevented from being irradiated with the laser beam 40 or the like that passes through the first hole 11a and being damaged.

In the crystal resonator 1, the first hole 11a, the second hole 12a, and the third hole 13a included to the through hole 14 have the circular shape. However, the holes are not limited to be formed in the circular shape, but they may be formed in an oval shape, a triangular shape, a rectangular shape, a pentagonal shape, or other polygonal shape.

In the crystal resonator 1, the lid portion 10c of the package 10 may be made of glass instead of metal such as kovar. In this case, the bonding portion 10d is made of low-melting glass, and the low-melting glass is melted so as to bond the lid portion 10c and the frame portion 10b. In the crystal resonator 1 having such structure, the frequency of the tuning fork type crystal resonator element 20 can be adjusted after the sealing of the package 10 by irradiating an excitation electrode, which is not shown, of the crystal resonator element 20 with the laser beam transmitted through the lid portion 10c made of glass and etching the excitation electrode.

Here, a method for manufacturing the crystal resonator 1 will be described with reference to FIGS. 3A to 4B. FIGS. 3A to 4B are sectional views showing a method for manufacturing a crystal resonator in a processing order.

In the method for manufacturing the crystal resonator 1, the first, second, and third layers 11, 12, and 13 included in the base portion 10a are individually formed in a mass-producing sheet state, and the first hole 11a, the second hole 12a, and the third hole 13a are respectively formed by punching with a press, for example. Here, FIGS. 3A to 3E show each member not in the sheet state but in a piece state for descriptive purpose.

Second Layer Metal Coat Forming Step

Figure 3A:
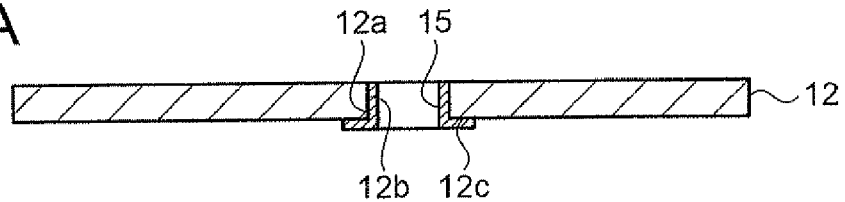
FIGS. 3A to 3E are sectional views showing a method for manufacturing a crystal resonator in a processing order.

As shown in FIG. 3A, the metal coat 15 is formed on the inner wall surface 12b of the second hole 12a and on the exposed surface 12c, which is exposed inside the third hole 13a, of the second layer 12. In a method for forming the metal coat 15 on the second layer 12, a metal film is printed so as to cover the exposed surface 12c and the second hole 12a with pasted metal such as tungsten. Then, for the inner wall surface 12b of the second hole 12a, the metal film that is printed is sucked from the opposite side of the printed side through the second hole 12a by vacuuming or the like. Thus, a metallization layer is formed on the inner wall surface 12b of the second hole 12a and the exposed surface 12c of the second layer 12.

Then films respectively made of nickel and gold are layered on the metallization layer by plating so as to obtain the metal coat 15. The films made of nickel and gold are preferably layered after the firing of the base portion 10a described later.

Third Layer Metal Coat Forming Step

Figure 3B:
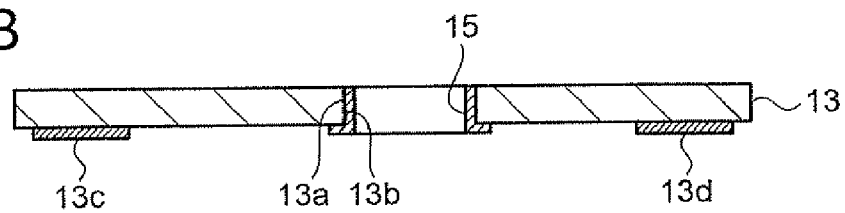

As shown in FIG. 3B, the metal coat 15 is formed on the inner wall surface 13b of the third hole 13a of the third layer 13 in the same manner as the above. At this time, the mounting terminals 13c and 13d are formed in the similar way.

Base Portion Forming Step

Figure 3C:
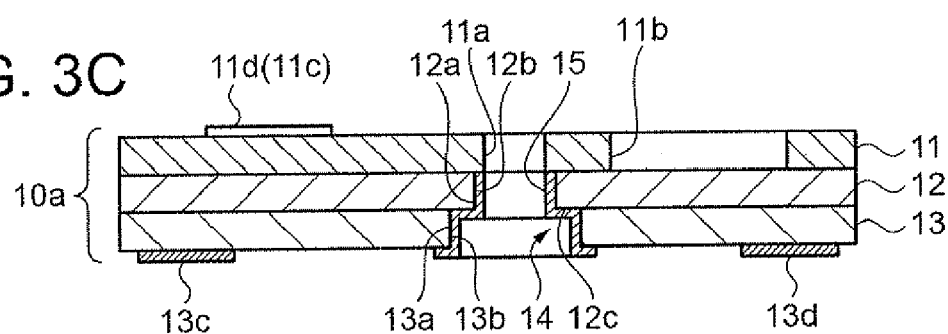

As shown in FIG. 3C, the first to third layers 11 to 13 are layered in a manner to allow the first to third holes 11a to 13a to overlap with each other so as to form the through hole 14.

Figure 3D:
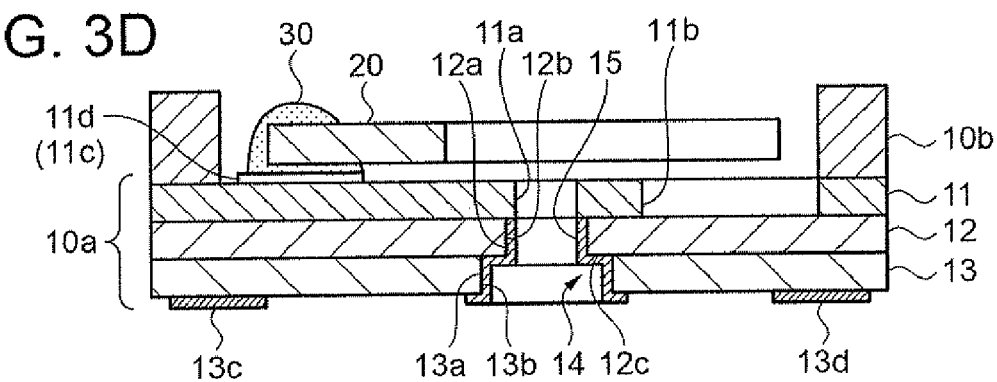

As shown in FIG. 3D, the frame portion 10b formed in the mass-producing sheet state in advance is stacked on the first layer 11 of the base portion 10a.

Then the first to third layers 11 to 13 and the frame portion 10b are fired by a firing furnace, which is not shown, so as to be bonded with each other, forming the base portion 10a to which the frame portion 10b is bonded.

Due to this firing, the metallization layer formed in the inner wall surface 12b of the second hole 12a and the exposed surface 12c of the second layer 12 and the metallization layer formed on the inner wall surface 13b of the third hole 13a of the third layer 13 are unified so as to firmly adhere to each surface.

Then the base portion 10a to which the frame portion 10b is bonded is divided from the mass-producing sheet state into pieces. This division may be performed after the following steps.

On the first layer 11, the electrodes 11c and 11d are formed before the layering in a similar method to the forming method of metal coat 15. The metal coat 15 is not formed in the first hole 11a of the first layer 11.

Here, a metallization layer (not shown) is formed also on a surface, on which the bonding portion 10d is placed, of the frame portion 10b before the layering in a similar method to the forming method of the metal coat 15.

Mounting Step

Then, as shown in FIG. 3D, the conductive adhesive 30 is applied to the electrodes 11c and 11d formed on the first layer 11 of the base portion 10a with a dispenser or the like.

Then the tuning fork type crystal resonator element 20 is mounted by positioning the electrode parts thereof on the electrodes 11c and 11d. The tuning fork type crystal resonator element 20 is obtained as follows: cutting a thin plate out of a raw stone of crystal at a predetermined cutting angle, polishing the plate into a tuning fork shape, forming the electrode part (not shown) on the plate, and adjusting a frequency.

Thus, the tuning fork type crystal resonator element 20 is electrically coupled and fixed through the electrode part to the electrodes 11c and 11d.

Figure 3E:
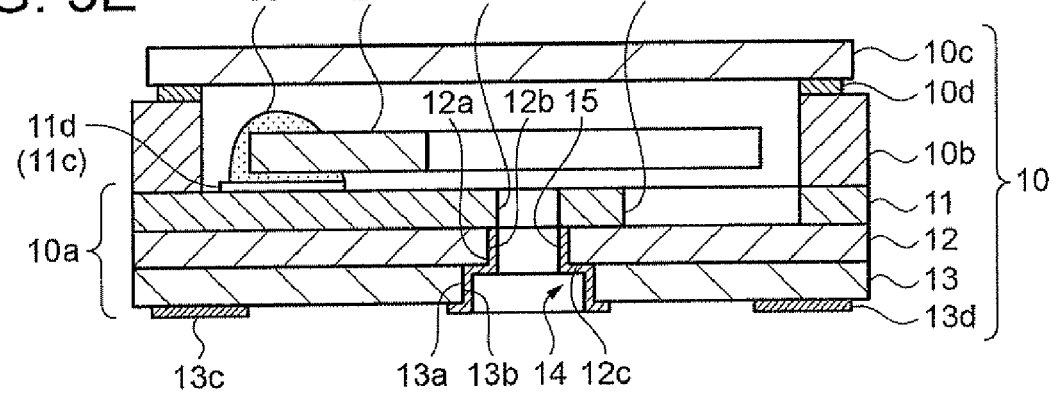

Then, as shown in FIG. 3E, the lid portion 10c is bonded to the frame portion 10b with the bonding portion 10d interposed by seam welding, brazing, or the like. In a case where the lid portion 10c is made of glass, the bonding portion 10d made of low-melting glass is adopted, and the bonding portion 10d is melted so as to bond the lid portion 10c and the frame portion 10b.

Sealing Step

Figure 4A:
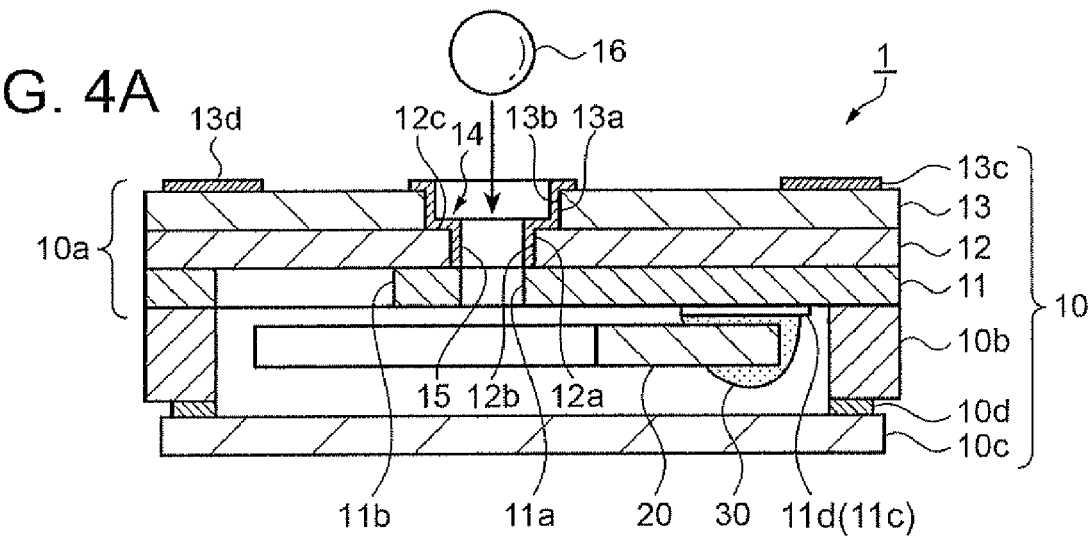
FIGS. 4A and 4B are sectional views showing the method for manufacturing a crystal resonator in a processing order.

Then, as shown in FIG. 4A, the crystal resonator 1 before sealing is turned over and the sealant 16 shaped in a spherical fashion is put in the third hole 13a in a chamber (not shown) that is vacuumed or filled with inert gas.

Figure 4B:
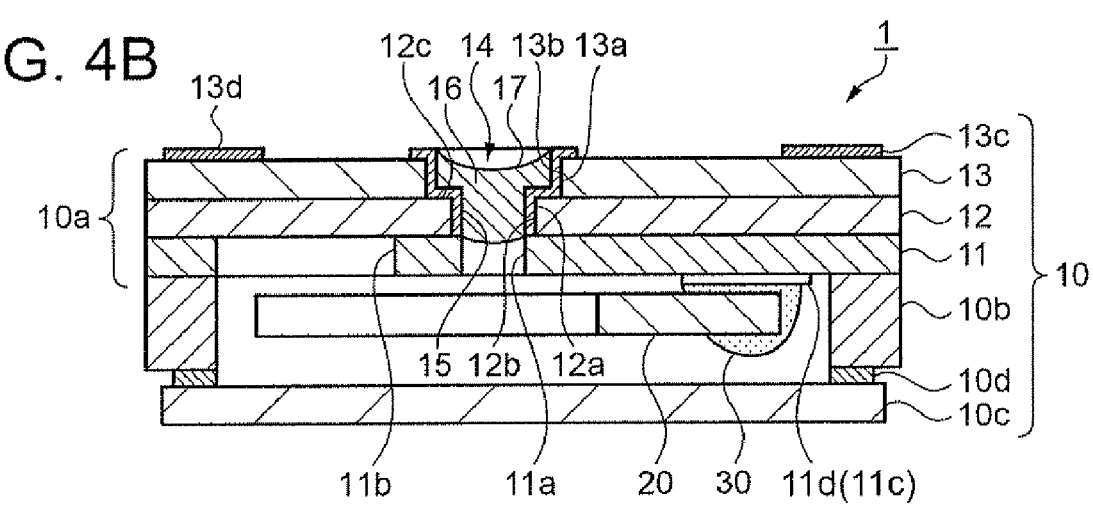

Next, as shown in FIG. 4B, the sealant 16 shaped in a spherical fashion is melted by being irradiated with an yttrium aluminum garnet (YAG) laser beam, a semiconductor laser beam, or the like, or being heated with the heating device so as to fill at least the second hole 12a. Thus the sealing part 17 is formed and the package 10 is sealed.

At this time, the sealant 16 that is melted spreads on the inner wall surface 12b of the second hole 12a, on which the metal coat 15 is formed, due to its wettability with respect to the metal coat 15, as described above, so as to fill the second hole 12a.

Subsequently, the sealant 16 overflowing from the second hole 12a evenly spreads in a radial fashion from the end, which is positioned at the second hole 12a side, of the exposed surface 12c toward the inner wall surface 13b of the third hole 13a.

At this time, the thickness of the sealant 16 from the exposed surface 12c increases from the center of the third hole 13a toward the inner wall surface 13b of the third hole 13b due to the wettability. Accordingly, the sealant 16 overflowing from the second hole 12a is not hemispherically raised so as not to be protruded toward the outside of the package 10.

On the other hand, the metal coat 15 is not formed in the first hole 11a, so that it is hard for the sealant 16 filling in the second hole 12a to spread in the first hole 11a due to the lack of the wettability. In addition, the first hole 11a has the shape same as or smaller than the second hole 12a, so that it is harder for the sealant 16 to spread in the first hole 11a.

Thus, the sealant 16 does not flow out of the first hole 11a to the inside of the package 10.

Sequentially, a characteristic inspection and the like are performed so as to obtain the crystal resonator 1 shown in FIG. 1.

As described above, in the method for manufacturing the crystal resonator 1, the metal coat 15 is formed on the inner wall surface 12b of the second hole 12a and the exposed surface 12c and the inner wall surface 13b of the third hole 13a, the first to third layers 11 to 13 are layered so as to form the through hole 14, and the first to third layers 11 to 13 are fired so as to be bonded. Then, the tuning fork type crystal resonator element 20 is mounted on the first layer 11 of the base portion 10a. After that, the sealant 16 is put in the third hole 13a in the vacuum or in the inert gas, and the sealant 16 is melted to fill the second hole 12a. Thus the sealing part 17 is formed, and the package 10 is sealed.

Accordingly, in the method for manufacturing the crystal resonator 1, when the sealing part 17 composed of the sealant 16 is formed by irradiating the sealant 16 with the laser beam or heating it by the heating device, the sealant 16 that is melted does not thinly spread and cover the second hole 12a unlike the related art. Accordingly, in the method for manufacturing the crystal resonator 1, an opening is not produced in the sealant 16.

Thus, the method for manufacturing the crystal resonator 1 can reduce sealing defect of the package 10 and prevent the tuning fork type crystal resonator element 20 stored in the package 10 from being irradiated with a laser beam that comes through the opening and being damaged.

Further, in the method for manufacturing the crystal resonator 1, the metal coat 15 is not formed in the first hole 11a, which is positioned to face the tuning fork type crystal resonator element 20, of the base portion 10a, so that it is hard for the sealant 16 to spread from the second hole 12a to the first hole 11a in forming the sealing part 17.

Accordingly, in the method for manufacturing the crystal resonator 1, the sealant 16 does not flow out of the base portion 10a toward the tuning fork type crystal resonator element 20, so that the sealant 16 can be prevented from contacting with the tuning fork type crystal resonator element 20 and therefore the vibrating performance of the crystal resonator element 20 can be prevented from being lowered unlike the related art.

Further, in the method for manufacturing the crystal resonator 1, the metal coat 15 is formed on the inner wall surface 13b of the third hole 13a of the third layer 13. Accordingly, in the method, the sealant 16 overflowing from the second hole 12a evenly spreads in a radial fashion through the exposed surface 12c of the second layer 12 to the inner wall surface 13b of the third hole 13a in forming the sealing part 17.

Accordingly, the method for manufacturing the crystal resonator 1 can reduce the generation of a void in the sealing part 17.

In the method, the metal coat 15 is formed on the inner wall surface 13b of the third hole 13a so as to be able to prevent the sealant 16 from flowing out of the third hole 13a due to the wettability with respect to the metal coat 15.

In the method for manufacturing the crystal resonator 1, since the sealing part 17 is formed at least in the second hole 12a, the sealant 16 does not necessarily spread in the third hole 13a of the third layer 13. Therefore, in the method, the third layer metal coat forming step can be omitted.

Accordingly, the number of manufacturing steps of the package 10 can be reduced in the method.

Modification

Figure 5:
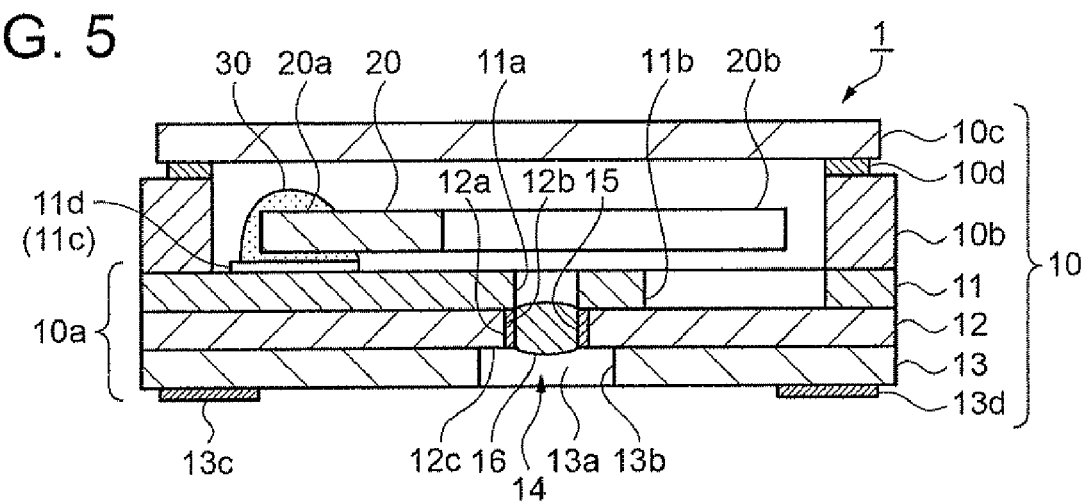
FIG. 5 is a sectional view showing a modification of the embodiment.

A modification will now be described. A plan view of the modification is same as the plan view of the above embodiment so as to be shown in FIG. 1A. While, a sectional view, taken along the A-A line of FIG. 1A, of the modification is shown in FIG. 5. A description common to that of the above embodiment shown in the sectional view, taken along the A-A line, of FIG. 1B will be omitted.

The different point from FIG. 1B is that the metal coat 15 is not formed on the exposed surface 12c, which is exposed inside the third hole 13a, of the second layer 12, and that the metal coat 15 is not formed on the inner wall surface 13b of the third hole 13a. On the inner wall surface 12b of the second hole 12a, the metal coat 15 is formed. Therefore, the opening 11b of the first hole 11a, the exposed surface 12c of the second layer 12, and the inner wall surface 13b of the third hole 13a on which the metal coat 15 is not formed have low wettability, while the inner wall surface 12b of the second hole 12a has high wettability. As a result, when the sealant is melted, the sealant runs through the inner wall surface 12b of the second hole 12a and preferentially fills the second hole 12a. The sealant can be prevented from going inside the package 10 through the first hole 11a. Since the sealant preferentially fills the second hole 12a that has a smaller diameter than the third hole 13a, the through hole 14 can be sealed even with a smaller amount of the sealant. Consequently, a low cost can be achieved.

Second Layer Metal Coat Forming Step in Modification

In the modification, the metal coat 15 is not formed on the exposed surface 12c, which is exposed inside the third hole 13a, of the second layer 12, while the metal coat 15 is formed on the inner wall surface 12b of the second hole 12a.

Pasted metal such as tungsten is printed on a surface, which is to be bonded to the first layer 11, of the second layer 12 in a manner to cover the second hole 12a so as to form a metal film. After that, the metal film is sucked by vacuuming or the like from the side which is to be bonded to the third layer 13. Thus, a metallization layer is formed on the inner wall surface 12b of the second hole 12a.

Then films respectively made of nickel and gold are layered on the metallization layer by plating so as to obtain the metal coat 15. The films made of nickel and gold are preferably layered after the firing of the base portion 10a.

In a case where the second layer is thin, the metal film reaches a part of the exposed surface 12c, which is exposed inside the third hole 13a, of the second layer 12, in the sucking step of the metal film. As a result, the metal coat 15 is formed on a part of the exposed surface 12c as well.

In the method for manufacturing the crystal resonator 1, the first to third layers 11 to 13 and the frame portion 10b are formed in the mass-producing sheet state and then divided into pieces, but they may be individually formed in the piece state from the beginning. Accordingly, the dividing step can be omitted in the method.

In the embodiment, the tuning fork type crystal resonator element 20 is described as an example of a piezoelectric resonator element, but it is not limited. The piezoelectric resonator element may be an AT-cut crystal resonator element, a surface acoustic wave resonator element, or the like. Further, lithium tantalate, lithium niobate, or the like may be employed as the piezoelectric material other than crystal.

In the embodiment, the crystal resonator 1 is described as a piezoelectric device, but the piezoelectric device may be a crystal oscillator, a surface acoustic wave resonator, a frequency filter, or the like.

Japanese Patent Application No. 2008-22430 is incorporated by reference in its entirety herein.

What is claimed is:

1. A piezoelectric device, comprising:
   a piezoelectric resonator element;
   a package storing the piezoelectric resonator element therein in a manner to mount the piezoelectric resonator element on a base portion thereof composed of at least three layers that are layered; and
   a through hole penetrating through the base portion, wherein the through hole includes:
   a first hole formed on a first layer that is positioned to face the piezoelectric resonator element among the at least three layers;
   a second hole formed on a second layer contacting with the first layer; a third hole formed larger than the second hole, on a third layer contacting with the second layer; and
   a metal coat formed on an inner wall surface of the second hole, and
   a sealing part for sealing the package is formed with a sealant in at least the second hole, wherein the metal coat is extended on an exposed surface of the second layer, the exposed surface being exposed inside the third hole.

2. The piezoelectric device according to claim 1, wherein the second hole has one of a same shape as the first hole and a shape larger than the first hole.

3. The piezoelectric device according to claim 1, wherein the metal coat is formed on an inner wall surface of the third hole of the third layer.

4. The piezoelectric device according to claim 1, wherein the piezoelectric resonator element is a tuning fork type resonator element, and the first layer has an opening formed on a portion thereof overlapping with an end portion of the tuning fork type resonator element in a planar view.

* * * * *